United States Patent [19]

Mariën et al.

[11] Patent Number: 5,376,501
[45] Date of Patent: Dec. 27, 1994

[54] PROCESS FOR INCORPORATION OF A WATER-INSOLUBLE SUBSTANCE INTO A HYDROPHILIC LAYER

[75] Inventors: August Mariën, Westerlo; Raf Voets, Hever; Rafaël Samijn, Wilrijk; Marc Stevens, Belsele, all of Belgium

[73] Assignee: Agfa-Gevaert, N.V., Mortsel, Belgium

[21] Appl. No.: 227,387

[22] Filed: Apr. 14, 1994

[30] Foreign Application Priority Data

Apr. 27, 1993 [EP] European Pat. Off. ............ 93201207

[51] Int. Cl.$^5$ .............................................. G03C 1/76
[52] U.S. Cl. .................................... 430/257; 430/259; 430/523; 430/533; 430/537; 430/933
[58] Field of Search ............... 430/257, 259, 523, 533, 430/537, 933; 523/201; 524/86, 89, 91, 94

[56] References Cited

U.S. PATENT DOCUMENTS 3,418,127 12/1968 Millikan ............................. 430/139
3,989,664 11/1976 Kawase et al. ..................... 524/291
4,910,235  3/1990 Satake et al. ...................... 524/605

FOREIGN PATENT DOCUMENTS 146337  6/1985  European Pat. Off. .

Primary Examiner—Hoa Van Le
Attorney, Agent, or Firm—Breiner & Breiner

[57] ABSTRACT

Processes are disclosed for incorporating a water-insoluble substance in a diffusion resistant form into a hydrophilic colloidal layer of an element. In a first process A the water-insoluble substance is present during the polycondensation of diol(s) or polyol(s) and carboxylic acids, whereby at least 6 mole % of the reagents bear a water-solubilizing group, preferably a sulpho group in the salt form; the obtained mixture of polyester and water-insoluble substance is then dispersed in an aqueous medium. In an alternative process B the polyester is first prepared and then mixed homogeneously with the hydrophobe substance by melting in a reactor or extruder; the mixture is then similarly dispersed. The obtained latex is then incorporated in a hydrophilic colloidal layer which is coated on a support.

The obtained element can serve as base for a reprographic image, e.g. a color proof image, or can form part of a complete photographic material.

In a preferred embodiment the water-insoluble substance is a brightening agent.

16 Claims, No Drawings

PROCESS FOR INCORPORATION OF A WATER-INSOLUBLE SUBSTANCE INTO A HYDROPHILIC LAYER

DESCRIPTION

1. Field of the Invention.

The present invention relates to a process for incorporating a water-insoluble substance into a hydrophilic layer, more particularly a hydrophilic layer of a photographic element, in a diffusion-resistant form.

2. Background of the Invention.

In the colour field of pre-press graphic arts there has been a long felt need for a simple and fast technique offering "colour proofs" of high quality and reproducibility.

Photographically produced colour proofs are a simulation for multicolour halftone reproductions as will be produced by successive printing in register with the separate standard inks: magenta, yellow, cyan and black on a conventional printing press.

A process for producing a multicolour pattern using silver halide emulsion materials is described in published European Patent Application EP 0 185 410. This method comprises the following steps:

(1) the scanningwise exposure of a multicolour original attached to a rotating scanner drum in order to obtain separate red light, green light and blue light output signals received by photon-detectors to produce corresponding electrical signals, which are fed into a computer, (2) the computer controlled exposure, of differently coloured hardening developable photographic materials each comprising on a temporary support one or more hardenable hydrophilic colloid layers at least one of which contains dispersed photosensitive silver halide, either (3) transferring integrally said hydrophilic colloid layer(s) of a first of said exposed photographic materials onto a permanent support, which at its surface is less hydrophobic than the temporary support, by pressing the permanent support in the presence of an aqueous liquid against the hydrophilic colloid layer side of said photographic material and removing the temporary support, thus leaving said hydrophilic colloid layer(s) on said same permanent support, and (4) developing the transferred exposed photosensitive silver halide with a hardening developing agent to form imagewise hardened coloured hydrophilic colloid portions and removing the non-hardened colloid portions to leave a coloured relief image on the permanent support, and (5) producing a multicolour pattern on said same permanent support by repeating the steps (3) and (4) with one or more other scanning-wise exposed differently coloured photographic materials, the transfer procedure of step (3) being effected in image register.

The permanent support preferably comprises a paper base and an overcoat consisting of a white opaque gelatinous layer. As opacifying agent titanium oxide can be used, the anatase modification of which is preferred because of better neutral whiteness compared to the futile form which shows a slightly yellow hue at high concentrations. The amount of titanium oxide controls the so-called "dot gain" in the colour proof which should be an accurate simulation of the dot gain in the actual printing process As additional opacifying agent polymeric particles consisting of hollow spherical core/sheat beads as manufactured by ROHMA AND HAAS Co, and sold under the trade name ROPAQUE can be used.

A permanent support as described above is employed in the AGFAPROOF (registered trade mark) colour proofing system, marketed by Agfa-Gevaert N.V. However, despite the presence of titanium dioxide and ROPAQUE particles in the hydrophilic gelatinous overcoat some customers judge the whiteness of the AGFAPROOF support as insufficiently brilliant and slightly yellowish. Therefore the use of an extra brightening agent in the overcoat of the support is desirable.

Most often optical brighteners are water-soluble substances. When added to a gelatinous hydrophilic coating composition as a simple solution it can be expected that they will not be diffusion-resistant in a wet coated gelatinous layer so that they will diffuse out during each processing cycle. As alternative essentially water-insoluble brighteners can be used and then the problem arises how to incorporate them in a gelatinous hydrophilic coating composition in a stable form. A prior art potential solution to this problem consists of loading the hydrophobe substance, e.g. a brightener, on a latex.

There are different ways of preparing loaded latices. In a conventional procedure the latex is added to a solution of the hydrophobe in a water-miscible organic solvent with low boiling point, and later on the solvent is evaporated. Such a procedure is described in e.g. U.S. Pat. Nos. 4,203,716, 4,214,047, 4,247,627, 4,304,769 and GB 1.504.949.

U.S. Pat. No. 3,418,127 describes a method of loading a brightener during the latex synthesis. In EP 0 146 337 a process is described comprising dissolving a brightener in a mixture of vinyl monomers, dispersing in water and polymerising in conditions suited for suspension polymerisation. In both the latter processes the brightener has to be soluble in the mixture of ethylenically unsaturated starting monomers. In *Research Disclosure* Item 17631, Dec. 1978, a method is described for preparing a loaded latex without the use of organic solvents comprising mixing the latex with the hydrophobe and stirring the mixture above the melting point of the hydrophobe. This is only feasible for hydrophobes with a melting point lower than the boiling point of the latex (100 ° C.).

Most processes for preparing and incorporating loaded latices are cumbersome and require organic solvents which is disadvantageous from an ecological point of view. Moreover, even when loaded on a latex some brightening agents will not become completely diffusion-resistant in a gelatinous coated layer. Some brighteners which can be loaded on a latex show other drawbracks, e.g. a lack of fastness to light. Other brighteners which show not the latter drawback cannot be loaded on a latex, e.g. because of insufficient solubility in a water-miscible organic solvent.

So there is need for a new simple technique for incorporating brightening agents in a hydrophilic gelatinous layer in a diffusion-resistant form.

A similar reasoning holds for any essentially water-insoluble ingredient which due to this property cannot be incorporated in a simple way into an hydrophilic colloidal layer of an element without causing problems of e.g. flocculation, crystallization, diffusion, etc.

It is an object of the present invention to provide a relative simple process for incorporating an essentially water-insoluble substance into a hydrophilic colloidal layer of an element in a diffusion-resistant form.

It is a further object of the present invention to provide a process for obtaining an element which can serve as image carrier for a colour proof image.

It is still a further object of the present invention to provide a process for obtaining an element which forms part of a photographic material.

SUMMARY OF THE INVENTION

The objects of the present invention are realized by providing a process for incorporating a water-insoluble substance into the hydrophilic colloidal layer of an element, comprising a support and a hydrophilic colloidal layer, in a diffusion-resistant form, comprising following steps:

(1) preparing a homogeneous mixture of a polyester and a water-insoluble substance by the following substeps:
 (1.1) preparing a mixture of:
  (a) one or more diol(s) or polyol(s) or a mixture thereof,
  (b) one or more di- or polycarboxylic acid(s) or lower alkyl ester(s) thereof, or a mixture thereof, with the proviso that at least 6 mole % of the compounds of the mixture of (a) and (b) bear a water-solubilizing group,
  (c) at least one polymerisation catalyst, then either, (1.2) adding to said mixture said water-insoluble substance, (1.3) effecting a polycondensation reaction by heating, thus forming a homogeneous mixture of said water-insoluble substance and of a polyester resin containing recurring ester groups derived from said diol(s) or polyol(s) and from said di- or polycarboxylic acid(s), or,
 (1.2′) effecting a polycondensation reaction by heating, thus forming a polyester resin containing recurring ester groups derived from said diol(s) or polyol(s) and from said di- or polycarboxylic acid(s),
 (1.3′) compounding the obtained polyester resin, after cooling and milling, with the water-insoluble substance, melting and homogenizing in a rector, or melting and extruding,
(2) cooling said mixture of said water-insoluble substance and of said polyester resin and milling it to a powder or granulate,
(3) dispersing said powdered or granulated mixture into an aqueous medium and admixing this aqueous dispersion to a hydrophilic colloidal coating composition, or dispersing said mixture directly in a hydrophilic colloidal coating composition, and
(4) coating said hydrophilic colloidal coating composition onto a support thus forming the above defined element.

In a preferred embodiment of the present invention the one or more di- or polycarboxylic acid(s) or lower alkyl esters thereof consists of a mixture of isophtalic acid or a lower alkyl ester thereof, terephtalic acid or a lower alkyl ester thereof, and sulphoisophtalic acid or a lower alkyl ester thereof with the sulpho group in the salt form.

It is a particular advantage of the present invention that the dispersing step in an aqueous medium (step 3) can be performed without the aid of an organic solvent and even in absence of a surfactant.

By the process of this invention an element can be obtained which can function as permanent image carrier for a colour proof, e.g. a proof resulting from the AGFAPROOF process. In another embodiment this element can form part of a complete photographic material obtained by the additional coating of one or more silver halide emulsion layers on top of the hydrophilic colloidal layer.

By the particular way the water-insoluble compound, e.g. a brightener, is incorporated in the hydrophilic colloidal layer it is rendered diffusion-resistant when the element or photographic material is subjected to a wet treatment, in particular processing.

DETAILED DESCRIPTION OF THE INVENTION

As it is clear from the summary the homogeneous mixture of polyester and water-insoluble substance can be prepared by two different processes. In the first method (process A) the water-insoluble substance is added to the reaction mixture before copolymerisation and is incorporated during the polycondensation. In the second method (process B) the polyester is prepared in the absence of water-insoluble substance. The obtained resin is then compounded with the water-insoluble substance and a homogeneous mixture is obtained by melting in a reactor or an extruder.

It is an important and advantageous feature of the present invention that the milled mixture of polyester and water-insoluble substance can be dispersed in an aqueous medium without the aid of an organic solvent and without the aid of a surfactant; in other words, the milled mixture is self-dispersive in water. It is an essential feature of the present invention that this property is realized by effecting the copolymerisation under such circumstances that at least 6 mole % of the built-in recurring ester units bear a water-solubilizing group, preferably in the salt form. This water-solubilizing group can be introduced in the copolyester molecule via the diol or polyol compound(s) participating in the polycondensation or, more preferably, via the di- or polycarboxylic acid(s) or lower alkyl ester(s) thereof participating in the polycondensation.

Examples of water-solubilizing groups which can be introduced include e.g. a sulpho group, a sulphino group, a phosphono group, a phosphino group and a carboxyl group. A preferred water-solubilizing group is a sulpho group used in the salt form.

The diols or polyols for use in the copolymerisation reaction can be aliphatic, linear or branched, or cycloaliphatic. Useful examples include e.g. ethylene glycol, 1,3-propanediol, 1,2-propanediol, 1,4-butanediol, 1,5-pentanediol, 1,6-hexanediol, 1,4-cyclohexanediol, 1,2-cyclohexanediol, 1,3-cyclohexanediol, 1,4-benzenedimethanol, glycerol, trimethylolpropane and pentaerythritol.

Examples of diols or polyols carrying a water-solubilizing group are:

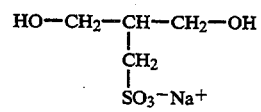

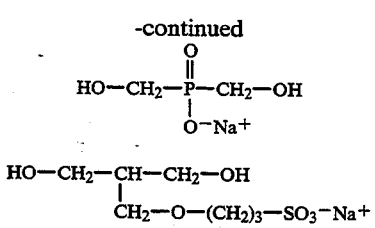

HO—CH₂—CH—CH₂—OH
         |
         CH₂—O—(CH₂)₃—SO₃⁻Na⁺

In principle mixtures of more than one diol or polyol can be used. However, in a preferred embodiment the diol used in the copolymerisation reaction is essentially one compound and most preferably ethylene glycol.

The di- or polycarboxylic acid(s) participating in the polycondensation reaction for the preparation of the polyester or the mixture of polyester and water-insoluble substance in principle can be aliphatic, cycloaliphatic or aromatic. Preferably the di- or polycarboxylic acid(s) are aromatic. When the water-solubilizing group to be incorporated in the polyester molecule is provided by one of the carboxylic acids at least 6 mole % of the carboxylic acids must bear such a water-solubilizing group, preferably a sulpho group in the salt form. In a preferred embodiment the carboxylic acid mixture essentially is a mixture of phtalic acid isomers or lower alkyl esters thereof of which at least 6 mole % bears a sulpho group in the salt form. In a most preferred embodiment the diol is ethylene glycol and the mixture of carboxylic acids essentially consists of from 20 to 60 mole % of isophtalic acid or a lower alkyl ester thereof, 6 to 10 mole % of sulphoisophtalic acid or a lower alkyl ester thereof with the sulpho group in the salt form, and terephtalic acid or a lower alkyl ester thereof in an amount to make 100 mole %. Such a copolymerisation mixture has been described in EP 0 029 620 and EP 0 078 559. Preferably the phtalic acids are used as lower alkyl esters, e.g. methyl esters.

Other useful examples of aromatic and aliphatic carboxylic acids include:
2,6-naphtalene-dicarboxylic acid,
1,5-naphtalene-dicarboxylic acid,
1,4-naphtalene-dicarboxylic acid,
1,7-naphtalene-dicarboxylic acid,
1,4-diphenylene-dicarboxylic acid,

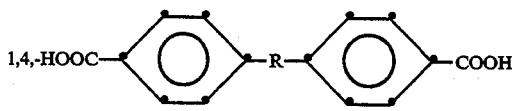

where R can represent O, SO₂, CH₂, C(CH₃)₂, and cyclohexyl,
trimeric acid,
trimellitic acid or its anhydride,
pyromellitic acid or its anhydride.

In the case of process A the water-insoluble substance is simply added to the mixture of carboxylic acid(s) and alcohol(s). No organic solvent is used. The hydrophobic substance is added in an amount preferably between 0.1 and 5% by weight.

When the carboxylic acids are used in a lower alkyl form, e.g. the methyl form, then first a re-esterification reaction takes place before the proper polycondensation. Suitable catalysts for the re-esterification include salts of zinc, manganese, magnesium, calcium and sodium. A preferred catalyst is zinc acetate. Suitable catalysts or the polycondensation include antimony trioxide and germanium dioxide. Titanium salts, e.g. tetraisopropyltitanate, can act as catalysts for both the re-esterification and the polycondensation.

Further on during the polycondensation a so-called thermal stabilizer is preferably present, e.g. phosphate- and phosphite esters like trimethyl-, triethyl-, triphenyl phosphate or -phosphite.

The specific reaction conditions for the polycondensation are of course dependent on the nature of the alcohols and acids used. In the preferred case of a mixture of ethylene glycol and of lower alkyl esters of phtalic acid isomers the reaction conditions preferably comprise re-esterification between 160°–250° C., polycondensation between 230°–280° C., and the presence of zinc acetate, antimony trioxide and triphenyl phosphate.

When the polycondensation reaction is finished the copolymer melt is allowed to settle down, e.g. on a metal foil, and is cooled. In the preferred case of a mixture of ethylene glycol and phtalic acids a homogeneous, clear and brittle polymer plate is obtained. It is self-evident that the water-insoluble ingredient must be thermostable up to the highest temperature in the polycondensation reaction and must remain homogeneously mixed with the obtained polyester on cooling.

The obtained homogeneous mixture of polyester and water-insoluble ingredient is then milled to a powder or granulate.

According to alternative process B the copolymerisation is performed in the absence of the water-insoluble compound. A similar milled polyester powder or granulate is obtained. Then the polyester is compounded with the water-insoluble substance and melted to a temperature between 230° C. and 280° C. in a reactor or extruder. In the case of a reactor the obtained mixture is allowed to settle down, e.g. on a metal foil, and is milled to a powder or granulate. In the case of an extruder the mixture is extruded in the form of fibres which are milled or granulated.

Finally the mixture of polyester and water-insoluble ingredient prepared according to process A or process B is dispersed in an aqueous medium. In principle this medium can be directly a hydrophilic gelatinous coating composition. More preferably the mixture is dispersed in essentially pure water by simply stirring and heating to about 75°–95° C. As pointed out earlier, it is a particular advantage of the present invention that, thanks to the presence of water-solubilizing groups in the recurring ester units, the resin is self-dispersive, so no use of an organic solvent is needed. A dispersing agent (a surfactant) can be used but is not indispensable. A stable dispersion can be obtained with a polyester latex concentration up to about 40% by weight. From such a latex an adequate amount can be mixed to a gelatinous hydrophilic coating composition which by coating can give rise to an element with a particular application.

As stated above the practice of the present invention is particularly suitable for the incorporation of a water-insoluble brightening agent. Useful classes of optical brighteners include coumarins, stilbenes, oxazoles, oxadiazoles, benzoxazoles, imidazoles, benzimidazoles, pyrazolines, triazines, imidazolones and naphtotriazoles. Specific examples of such brightening agents are disclosed for instance in *Research Disclosure* Item 17643, paragraph V, in U.S. Pat. No. 3,666,680 and in DE 2509342.

A most preferred brightener which can be incorporated in a hydrophilic layer by the process of the present invention in a particularly useful way is LEUCOPUR EGM (Colour Index 236), marketed by Sandoz AG, and corresponding to following chemical formula (Br-I1):

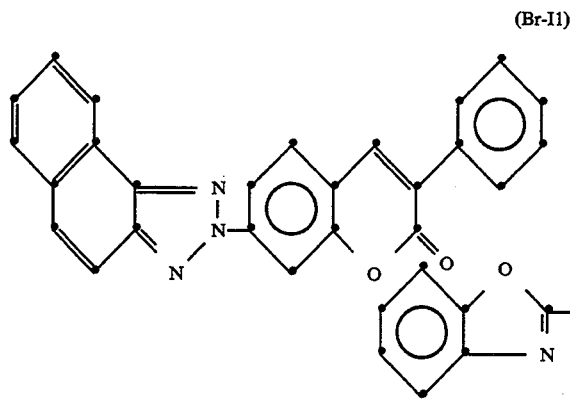

(Br-I1)

The present invention is particularly useful for the incorporation of this particular brightener into a hydrophilic layer because of the fact that, due to its low solubility in organic solvents, this compound cannot be loaded on a latex. Neither can the substance be incorporated by the methods of U.S. Pat. No. 3,418,127 or EP 0 146 337 cited above. So another way of incorporation had to be found and the process of the present invention proved to be an excellent solution to this problem as will be illustrated by the examples later on.

Other brighteners which can be advantageously incorporated according to this invention include following compounds:

EASTOBRITE OB-1, marketed by Eastman Kodak, and corresponding to following chemical formula (Br-I2):

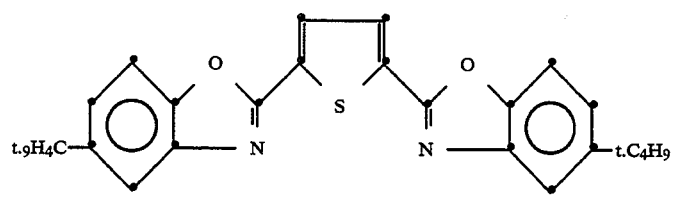

(Br-I2)

UVITEX OB, marketed by Ciba-Geigy, and corresponding to following chemical formula (Br-I3):

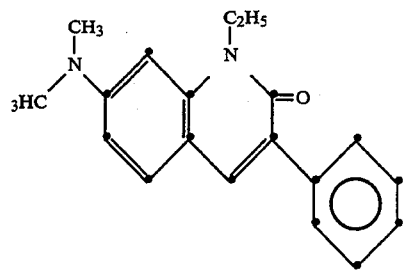

(Br-I3)

Examples of other brightening agents which can be incorporated in a hydrophilic layer in a way not belonging to the scope of the present invention, e.g. as a loaded latex, and which will serve as control compounds in the examples lateron, include BL3BLANCOPHOR FBO (Bayer AG) (Br-C1), BLANCOPHOR RKH FUR 766 (Bayer AG) (Br-C2) and BLANCOPHOR PSG (Bayer AG) (Br-C3). These compounds are represented by following formulas:

(Br-C1)

-continued

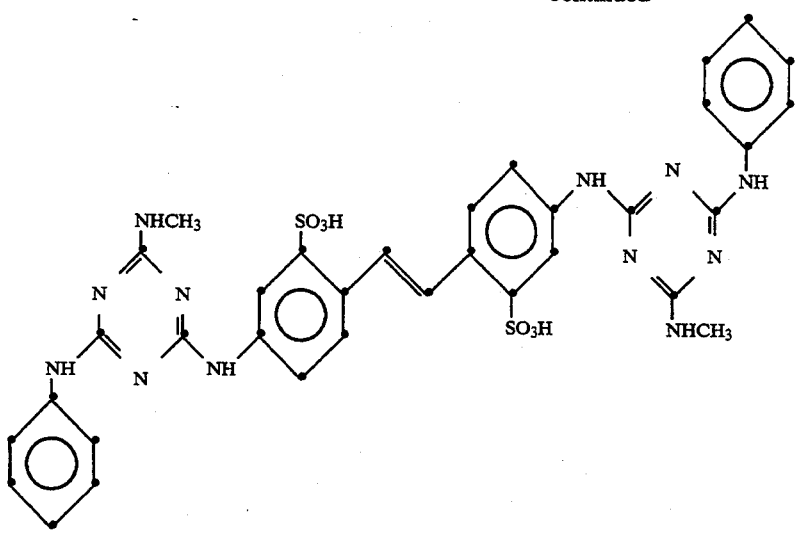

(Br-C2)

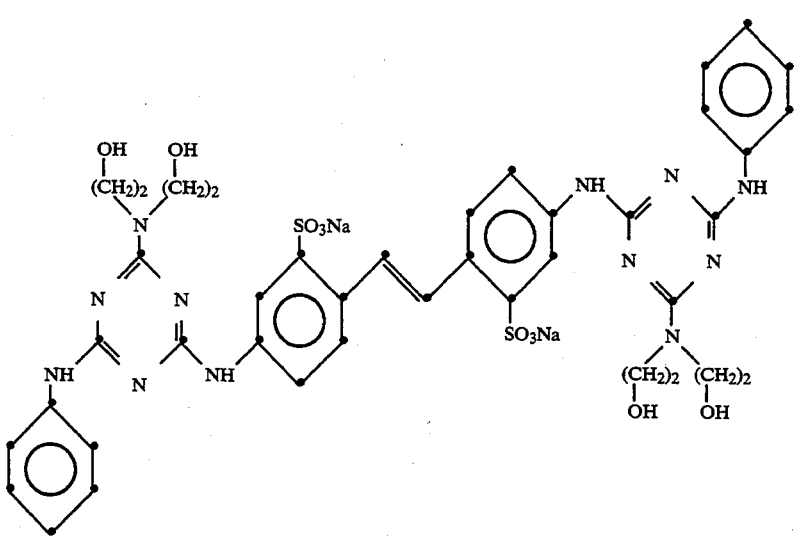

(Br-C3)

In our experiments the two last control compounds have to be used, not as free acid or as sodium salt, but as hexylamine salts. Otherwise they are too water-soluble and cannot be used as loaded latices.

A hydrophilic coating composition containing a latex of the homogeneous mixture of polyester and water-insoluble ingredient can be applied to a support by any method known in the art, e.g. air-knife coating, slide hopper coating, extrusion coating, dip coating or curtain coating. In this way the water-insoluble ingredient is incorporated in the element in a diffusion-resistant form as will be illustrated by the examples furtheron. The thus obtained element can serve for several different purposes. According to the particular application of this element the coated hydrophilic layer will contain additional particular ingredients.

In a partular useful application the element will serve as carrier for a reprographic image, e.g. a colour proof image. In this case the support preferably is a paper base having preferably a thickness range corresponding to a weight per square meter between 50 g/m² and 300 g/m². The paper base is preferably covered with a polyolefine coating, e.g. polyethylene or polypropylene, preferably at a coverage ranging between 5 g/m² and 40 g/m². The polyolefine layer itself may contain titanium dioxide, either futile or anatase or a mixture of them. Alternatively the support of the receptor material can be an organic polymeric resin support, e.g. a polyethylene terephtalate support. This support may itself be opacified with titanium dioxide particles, either futile or anatase or mixtures of them, preferably at a concentration between 10 and 35 weight percent in respect of the polyethylene terephtalate weight. In order to assure a good adhesion of support and hydrophilic binder layer a corona discharge treatment or a subbing layer can be applied to the support.

In this application for reprography the hydrophilic layer containing the dispersed mixture of polyester and brightener is coated at a gelatin coverage preferably ranging from 0.5 g/m² to 5 g/m². Preferably additional opacifying agents, e.g. titanium dioxide and polymeric hollow core/shear beads are incorporated into the hydrophilic layer. The futile or anatase titanium dioxide modification or a mixture of them can be used. The anatase modification is preferred for its better neutral whiteness. Particular useful hollow spherical core/sheat beads are described in U.S. Pat. Nos. 4,427,836, 4,468,498 and 4,469,825. A preferred material is manufactured by ROHM AND HAAS Co, and sold under the trade name ROPAQUE (e.g. ROPAQUE type no. OP-62 and OP-84). A particular useful type is described as a hollow sphere composed of a copolymer of acrylic acid and styrene. During drying of the hydrophilic binder layer the enclosed water diffuses out of the inner sphere leaving an inner air containing center which enhances the light-scattering properties due to the refraction index transition at the sheat/air interphase. The hollow bead particles are used as a dispersion of 10–40% active product. They are preferably present in the hydrophilic layer in an amount between 0.5 g/m$^2$ and 5 g/m$^2$ (active product), and most preferably in an amount of about 2 g/m$^2$.

By optimizing the relative amounts of brightener incorporated in the polyester blend, hollow beads and titanium dioxide a brilliant neutral white outlook of the element can be obtained.

The hydrophilic layer further can contain various spacing and/or matting agents, e.g. amorphous or crystalline silica particles, or hard polymeric beads, preferably showing an average particle size of 2 to 5 micron.

The hydrophilic layer further can contain compounds improving the dimensional stability of the element on processing. This is especially important when the element serves as carrier for an AGFAPROOF colour image in which case four processing cycles are performed. Suitable additives for improving the dimensional stability of the element are e.g. dispersions of a water-insoluble or hardly soluble synthetic polymer e.g. polymers of alkyl(meth)acrylates, alkoxy(meth) acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth)acrylates.

The gelatinous hydrophilic layer may further comprise various kinds of surface-active agents. Suitable surface-active agents include non-ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, arainoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Such surface-active agents can be used for various purposes e.g. as coating aids, as compounds preventing electric charges, as compounds improving slidability, and as compounds preventing or reducing adhesion.

Typically the hydrophilic layer further will contain one or more hardening agents. Hardening agents include those of the epoxide type, those of the ethylenimine type, chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts as disclosed in U.S. Pat. No. 4,063,952.

In another preferred embodiment, explicitly forming part of the present invention, the element, comprising a support and a hydrophilic layer containing the dispersed mixture of polyester and water-soluble ingredient, forms part of a complete photographic material. This is realized by coating one or more silver halide photosensitive layers on top of the hydrophilic layer which in this way becomes a so-called "undercoat". When the water-insoluble substance again is a brightener this particular arrangement is especially useful for so-called phototype-setting- or image-setting materials used in pre-press graphic arts. The function of the hydrophilic undercoat in this application is essentially the same as described above, that is providing a brillant neutral whiteness in the non-image background areas of the exposed and developed photographic material. Furtheron the hydrophilic undercoat can contain developing agents in the particular case of so-called activation type materials, e.g. the RAPIDOSET materials, marketed by AGfa-Gevaert N.V. In this case the development is carried out with a so-called activator liquid being an aqueous alkaline solution substantially free from developing agents. Typical activator liquids comprise, for example, an aqueous solution of an alkaline material, such as sodium carbonate, sodium hydroxide, potassium carbonate, potassium hydroxide, mixtures of sodium hydroxide and sodium sulfite, organic alkaline substances, e.g. alkanolamines, etc. A suitable activator bath comprises e.g. about 2 percent by weight of sodium hydroxide and 0.5 percent by weight of sodium sulphite.

The composition of the silver halide emulsion incorporated in a photographic element of the present invention is not specifically limited and may be any composition selected from e.g. silver chloride, silver bromide, silver iodide, silver chlorobromide, silver bromoiodide, and silver chlorobromoiodide.

The photographic emulsion(s) can be prepared from soluble silver salts and soluble halides according to different methods as described e.g. by P. Glafkidès in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

Two or more types of silver halide emulsions that have been prepared differently can be mixed for forming a photographic emulsion. The average size of the silver halide grains may range from 0.05 to 1.0 micron, preferably from 0.2 to 0.5 micron. The size distribution of the silver halide particles can be homodisperse or heterodisperse.

The light-sensitive silver halide emulsions are preferably chemically sensitized as described e.g. in the above-mentioned "Chimie et Physique Photographique" by P. Glafkidès, in the above-mentioned "Photographic Emulsion Chemistry" by G. F. Duffin, in the above-mentioned "Making and Coating Photographic Emulsion" by V. L. Zelihan et al, and in "Die Grundlagen der Photographischen Prozesse mir Silberhalogeniden" edited by H. Frieser and published by Akademische Verlagsgesellschaft (1968).

The light-sensitive silver halide emulsions can be spectrally sensitized with methine dyes such as those described by F. M. Hamer in "The Cyanine Dyes and Related Compounds", 1964, John Wiley & Sons. Dyes that can be used for the purpose of spectral sensitization include cyanine dyes, merocyanine dyes, complex cyanine dyes, complex merocyanine dyes, hemicyanine dyes, styryl dyes and hemioxonol dyes. Particularly valuable dyes are those belonging to the cyanine dyes, merocyanine dyes and complex merocyanine dyes.

The silver halide emulsion(s) for use in accordance with the present invention may comprise compounds preventing the formation of fog or stabilizing the photographic characteristics during the production or storage of photographic elements or during the photographic treatment thereof. Many known compounds can be added as fog-inhibiting agent or stabilizer to the silver halide emulsion.

The silver halide emulsion layer can consist of simply one single layer containing one or more emulsions, or can be composed of a double layer or even a multiple layer. Above the emulsion layer(s) usually a protective layer is applied which can contain conventional photographic ingredients such as matting agents, spacing agents, UV-absorbers, plasticizers, antistatics, lubricants, wetting agents and hardeners. The photographic material can be further provided with one or more backing layers serving for anti-halation and/or for anti-curl purposes.

The thus obtained photographic material must be exposed and processed according to its particular composition and application.

Although the present invention has been described in detail for the incorporation of a brightening agent into a hydrophilic layer it will be clear to any person skilled in the art that the same process can be equally applied for the incorporation of other useful essentially water-insoluble ingredients, e.g. an UV-absorber, an anti-oxidant, a dye, a spectral sensitizer, an IR-absorbing compound, a polymerisable monomer, a photopolymerisation initiator, a developing agent, etc.

An example of a well-known UV-absorber which can be incorporated by the process of the invention is TINUVIN 327, marketed by Ciba-Geigy AG, and corresponding to following chemical formula (UV-1):

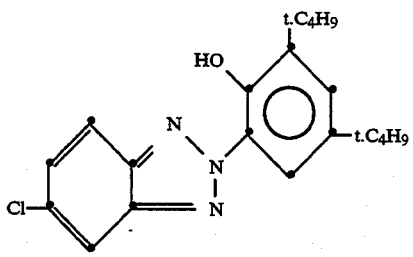

An example of a useful anti-oxidant is IRGANOX 1222, marketed by Ciba-Geigy AG, which formula is given below (AO-1):

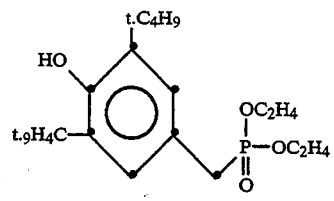

The present invention is illustrated by the following examples although it is not limited thereto.

EXAMPLES

Preparative Example 1

The preparation of a mixture of polyester and water-insoluble compound according to process A is illustrated in this example.

A reaction mixture of:
- 1028.2 g of dimethyl terephthalate (5.3 moles)
- 776 g of dimethyl isophthalate (4.0 moles)
- 207.2 g of 5-sulphoisophthalic acid dimethyl ester sodium salt (0.7 mole)
- 1240 g of ethylene glycol (20 moles)
- 220 mg of zinc acetate dihydrated
- 292 mg of antimony(III)oxide
- 20 g LEUCOPUR EGM (Sandoz) (1% by weight vis-à-vis the total weight of final polyester), was heated to 160° C. whilst stirring under nitrogen atmosphere.

At that temperature re-esterification took place and methanol was distilled. Gradually the temperature was raised over a period of 3 to 4 h up to 250° C., until no methanol distilled anymore. 652 mg of triphenyl phosphate was added as a thermal stabilizer. Thereupon the reaction mixture was subjected to a reduced pressure of about 0.5 mbar. Under these conditions the polycondensation took place within a period of about 120 min. The polyester melt was allowed to settle on an aluminium foil and cooled to 25° C. A homogeneous, transparent and brittle solid was obtained. This solidified copolyester was milled to a powder. The intrinsic viscosity [$\eta$] of the copolyester was from 0.30 dl/g measured at a temperature of 25° C. in a 60/40 mixture of phenol and o-dichlorobenzene (60/40 by weight).

The preparation of a stable aqueous copolyester dispersion for use according to the present invention was carried out as follows:

in a 1-litre round-bottomed flask a mixture of 100 g of the above copolyester in powder form and 400 ml of water was heated to 95° C. whilst stirring. Through a viscous phase the resin is transformed slowly into a dispersion. The mixture is stirred for 2 hours and filtrated after cooling to 25° C. A stable aqueous dispersion of copolyester was obtained with following characteristics:
- concentration: 20% by weight
- particle size: 25–75 nm
- viscosity: 5–10 mPas
- storage stability at 25° C.: at least 6 months.

Preparative Example 2

A reaction mixture similar to that of example 1 was prepared with the exception that LEUCOPUR EGM was omitted (process B). A similar polycondensation as in example 1 was performed. The obtained copolyester was cooled and grinded to a powder.

1000 g of this polyester powder was compounded with 10 g of LEUCOPUR EGM and this mixture was melted up to 255° C. in a reactor whilst stirring under nitrogen atmosphere. After 15 minutes of stirring the homogeneous melt was allowed to settle on an aluminium foil, cooled down and milled to a powder.

Finally this mixture of polyester and brightener was dispersed in water in a way identical to example 1.

Preparative Example 3

A similar mixture of polyester and LEUCOPUR EGM (process B) was homogenized by melting and extruding at 255° C. The remain period in the extruder was about 10 minutes. The extruded polyester fibres were granulated.

Finally this mixture of polyester and brightener was dispersed in water in a way identical to example 1.

Example 4: evaluation

A coating composition was prepared containing 9.0 g of gelatin, 80 g of titanium dioxide of the anatase modification and 80 g of a 21.5% dipersion of ROPAQUE-OP 62 LO polymeric core-sheat beads. These beads constitute a deaminated derivative of the original ROPAQUE OP 62, obtained by treatment with a cationic ionex-change resin. The coating solution further contained a conventional matting agent, a polyethylacrylate plasticizer, formaldehyde as hardening agent and two conventional wetting agents. This coating composition was divided in aliquot portions and to the different samples was added brightening agent (Br-I1) incorporated in a polyester by the process of the present invention and prepared according to the previous example, in concentrations as illustrated by table 1, or control brightening agent (Br-C1) loaded on IMPRANIL latex. This latter latex consists of a 40% aqueous dispersion of a polyurethane prepared from DESMODUR W (trade name), which is a dicyclohexylmethane diisocyanate also sold by BAYER A. G., and a polyester having a low molecular weight of about 800.

The coatings were diluted to about 750 ml and coated at a gelatin coverage of 1.41 g/m². The support consisted of a paper of a weight of 180 g/m² coated on beth sides with a polyethylene layer of 30 g/m².

TABLE 1

| Sample No. | brightener | active product/m² |
|---|---|---|
| 1 | — | — |
| 2 | Br-I1 | 1.5 mg |
| 3 | Br-I1 | 3.0 mg |
| 4 | Br-I1 | 6.0 mg |
| 5 | Br-C1 | 3.0 mg |

The samples were evaluated for whiteness by measurement of their Lab values according to the CIE colorimetric system on a GRETAG SPM50 spectrophotometer. The results are summarized in table 2.

TABLE 2

| Sample No; | CIE-LAB values | | |
|---|---|---|---|
| | L | a | b |
| 1 | 96.6 | 0 | 0.7 |
| 2 | 97.0 | 0.2 | 0.2 |
| 3 | 97.0 | 0.4 | −0.3 |
| 4 | 97.2 | 0.7 | −1.0 |
| 5 | 97.2 | 0.5 | −0.2 |

In relation to the visual evaluation of the whiteness the b value proved to be the most important parameter. It was established from a market survey that customers preferred a whiteness corresponding to a slightly negative b value (slightly blueish) and certainly disliked a yellowish hue (positive b value). The results in table 1 show that the addition of a brightener incorporated in a polyester latex according to a process of the present invention shifts the b value in the desired direction comparable to the result obtained with control brightener Br-C1.

Samples 3 and 5 were subjected to a 4 hour and 24 hour Xenon test (180 klux) for evaluation of fastness to light. The shift to yellow illustrated by the change in b value is illustrated in table 3:

TABLE 3

| Sample No. | ○b after 4 h Xe | ○b after 24 h Xe |
|---|---|---|
| 3 | +0.4 | +0.5 |
| 5 | +1.0 | +1.0 |

The shift to yellow is twice that bad with the sample containing control brightener Br-C1 compared to the sample containing the brightening agent Br-I1 incorporated according to the process of the present invention.

The diffusion-resistance of the brighteners in the samples was determined as follows. Complete AGFA-PROOF cycles were performed whereby each coated sample served as permanent support. Each cycle comprised four successive transfers of differently pigmented layers from a temporary support to each sample support, each transfer being followed by a processing including hardening development, a bleach-fix step and a wash-off step. The b value in the white non-image parts was determined before and after the complete AGFA-PROOF cycle. The results are summarized in table 4:

TABLE 4

| Sample No. | b value before | b value after | b |
|---|---|---|---|
| 1 | 0.6 | 1.0 | 0.4 |
| 2 | 0.2 | 0.6 | 0.4 |
| 3 | −0.4 | 0.0 | 0.4 |
| 4 | −1.1 | −0.7 | 0.4 |
| 5 | −0.2 | 0.4 | 0.6 |

Sample 1 containing no brightening agent shows a shift of the b value of 0.4 to more yellow after a complete cycle. Samples 2 to 4 show the same shift proving that brightener Br-I1 is incorporated in a diffusion-resistant form; otherwise the b value would shift to the same end-value as in sample 1. Control brightener Br-C1 behaves slightly worse.

Example 5: Evaluation

In a further test series the the diffusion-resistance of brightener Br-I1 was compared to the diffusion resistance of control brighteners Br-C2 and Br-C3 (stilbene derivatives in the hexylamine salt form) incorporated in the form of a loaded latex comparable to Br-C1. The shift in colorimetric b value was determined after a complete AGFAROOF cycle (4 times processing). The results are represented in table 5.

TABLE 5

| Sample No. | brightener | | b |
|---|---|---|---|
| 2 | Br-I1 | 1.5 mg/m² | 0.4 |
| 3 | Br-I1 | 3.0 mg/m² | 0.4 |
| 4 | Br-I1 | 6.0 mg/m² | 0.4 |
| 6 | Br-C2 | 4.0 mg/m² | 1.0 |
| 7 | Br-C2 | 8.0 mg/m² | 1.2 |
| 8 | Br-C2 | 16 mg/m² | 1.6 |
| 9 | Br-C3 | 3.5 mg/m² | 1.0 |

TABLE 5-continued

| Sample No. | brightener | | $\bigcirc_b$ |
|---|---|---|---|
| 10 | Br-C3 | 7.0 mg/m² | 1.4 |
| 11 | Br-C3 | 14 mg/m² | 1.7 |

From the increase in $\bigcirc_b$ with increasing concentrations it can be seen that the control brighteners are not diffusion-resistant unlike the brightener incorporated according to the invention.

We claim:

1. Process for incorporating a water-insoluble substance into the hydrophilic colloidal layer of an element, comprising a support and a hydrophilic colloidal layer, in a diffusion-resistant form, comprising the following steps:
   (1) preparing a homogeneous mixture of a polyester and a water-insoluble substance by the following substeps:
      (1.1) preparing a mixture of:
         (a) one or more diol(s) or polyol(s) or a mixture thereof,
         (b) one or more di- or polycarboxylic acid(s) or lower alkyl ester(s) thereof, or a mixture thereof, with the proviso that at least 6 mole % of the compounds of the mixture of (a) and (b) bear a water-solubilizing group,
         (c) at least one polymerization catalyst, then,
      (1.2) adding to said mixture said water-insoluble substance,
      (1.3) effecting a polycondensation reaction by heating, thus forming a homogeneous mixture of said water-insoluble substance and of a polyester resin containing recurring ester groups derived from said diol(s) or polyol(s) and from said di- or polycarboxylic acid(s),
   (2) cooling said mixture of said water-insoluble substance and of said polyester resin and milling it to a powder or granulate,
   (3) dispersing said powdered or granulated mixture into an aqueous medium and admixing this aqueous dispersion to a hydrophilic colloidal coating composition, or dispersing said mixture directly in a hydrophilic colloidal coating composition, and
   (4) coating said hydrophilic colloidal coating composition onto a support thus forming said element.

2. Process according to claim 1 wherein said one or more di- or polycarboxylic acid(s) or lower alkyl ester(s) thereof essentially consist(s) of one or more aromatic dicarboxylic acid(s) or lower alkyl ester(s) thereof.

3. Process according to claim 2 wherein said one or more di- or polycarboxylic acid(s) essentially consist of a mixture of from 20 to 60 mole % of isophtalic acid or a lower alkyl ester thereof, 6 to 10 mole % of sulphoisophtalic acid or a lower alkyl ester thereof with the sulpho group in the salt form, and terephtalic acid or a lower alkyl ester thereof in an amount to make 100 mole %.

4. Process according to claim 1 wherein said diol, polyol or mixture thereof essentially consists of ethylene glycol.

5. Process according to claim 1 wherein said essentially water-insoluble substance is a brightening agent.

6. Process according to claim 5 wherein said brightening agent corresponds to following chemical formula:

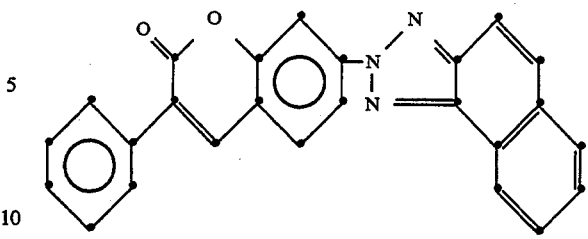

7. Process according to claim 1 wherein before effecting coating step (4) titanium dioxide is added to said hydrophilic colloidal coating composition.

8. Process according to claim 1 wherein before effecting coating step (4) hollow polymeric core-shear beads are added to said hydrophilic colloidal coating composition.

9. Process for incorporating a water-insoluble substance into the hydrophilic colloidal layer of an element, comprising a support and a hydrophilic colloidal layer, in a diffusion-resistant form, comprising the following steps:
   (1) preparing a homogeneous mixture of a polyester and a water-insoluble substance by the following substeps:
      (1.1) preparing a mixture of:
         (a) one or more diol(s) or polyol(s) or a mixture thereof,
         (b) one or more di- or polycarboxylic acid(s) or lower alkyl ester(s) thereof, or a mixture thereof, with the proviso that at least 6 mole % of the compounds of the mixture of (a) and (b) bear a water-solubilizing group,
         (c) at least one polymerization catalyst, then
      (1.2) effecting a polycondensation reaction by heating, thus forming a polyester resin containing recurring ester groups derived from said diol(s) or polyol(s) and from said di- or polycarboxylic acid(s),
      (1.3) compounding the obtained polyester resin, after cooling and milling, with the water-insoluble substance, melting and homogenizing in a reactor, or melting and extruding,
   (2) cooling said mixture of said water-insoluble substance and of said polyester resin and milling it to a powder or granulate,
   (3) dispersing said powdered or granulated mixture into an aqueous medium and admixing this aqueous dispersion to a hydrophilic colloidal coating composition, or dispersing said mixture directly in a hydrophilic colloidal coating composition, and
   (4) coating said hydrophilic colloidal coating composition onto a support thus forming said element.

10. Process according to claim 9 wherein said one or more di- or polycarboxylic acid(s) or lower alkyl ester(s) thereof essentially consist(s) of one or more aromatic dicarboxylic acid(s) or lower alkyl ester(s) thereof.

11. Process according to claim 10 wherein said one or more di- or polycarboxylic acid(s) essentially consist of a mixture of from 20 to 60 mole % of isophtalic acid or a lower alkyl ester thereof, 6 to 10 mole % of sulphoisophtalic acid or a lower alkyl ester thereof with the sulpho group in the salt form, and terephtalic acid or a lower alkyl ester thereof in an amount to make 100 mole %.

12. Process according to claim 9 wherein said diol, polyol or mixture thereof essentially consists of ethylene glycol.

13. Process according to claim 9 wherein said essentially water-insoluble substance is a brightening agent.

14. Process according to claim 13 wherein said brightening agent corresponds to following chemical formula:

[Chemical structure]

15. Process according to claim 9 wherein before effecting coating step (4) titanium dioxide is added to said hydrophilic colloidal coating composition.

16. Process according to claim 9 wherein before affecting coating step (4) hollow polymeric core-shear beads are added to said hydrophilic colloidal coating composition.

* * * * *